United States Patent [19]
Wong

[11] Patent Number: 5,543,740
[45] Date of Patent: Aug. 6, 1996

[54] INTEGRATED HALF-BRIDGE DRIVER CIRCUIT

[75] Inventor: Stephen L. Wong, Scarsdale, N.Y.

[73] Assignee: Philips Electronics North America Corporation, New York, N.Y.

[21] Appl. No.: 419,490

[22] Filed: Apr. 10, 1995

[51] Int. Cl.⁶ .................................................... H03B 1/00
[52] U.S. Cl. ............................................ 327/108; 327/74
[58] Field of Search ............................ 327/74, 76, 108, 327/109, 110, 111, 112, 182, 239, 259, 263, 264, 266, 268, 379

[56] References Cited

U.S. PATENT DOCUMENTS

| | | | |
|---|---|---|---|
| 3,683,284 | 8/1972 | Mueller | 327/74 |
| 4,550,308 | 10/1985 | Tokura et al. | 327/74 |
| 4,720,641 | 1/1988 | Faini | 307/18 |
| 5,134,322 | 7/1992 | Bourgeois et al. | 307/571 |
| 5,138,200 | 8/1992 | Barsanti et al. | 307/482 |
| 5,140,591 | 8/1992 | Palara et al. | 327/109 |
| 5,218,523 | 6/1993 | Sugishima | 363/132 |
| 5,365,118 | 11/1994 | Wilcox | 327/109 |
| 5,384,505 | 1/1995 | Takahashi | 327/264 |
| 5,394,020 | 2/1995 | Nienaber | 327/74 |
| 5,402,083 | 3/1995 | Shekhawat et al. | 327/74 |

FOREIGN PATENT DOCUMENTS

| | | |
|---|---|---|
| 0330628 | 8/1989 | European Pat. Off. . |
| 0367006A2 | 5/1990 | European Pat. Off. . |
| 0367006A3 | 5/1990 | European Pat. Off. . |
| 2180422 | 3/1987 | United Kingdom . |

OTHER PUBLICATIONS

"Drive Technique for High Side N–Channel MOSFETs" by Warren Schultz, Motorola Inc. SPS, PCIM Jun. 1987, pp. 34–40.

"An Integrated High–Voltage Bridge Driver Simplifies Drive Circuits In Totem–Pole Inverters" by Brian E. Taylor, PCCI Jun. 1988, pp. 166–171.

"Driving the SIPMOS Field–Effect Transistor as a Fast Power Switch" by E. Hebenstreit, Siemens Forsch u. Entwickl–Ber. Bd. 9 (1980)Nr. 4, pp. 200–204.

"High Voltage MOS Gate Driver", International Rectifier, Data Sheet No. PD–6.011B, IR2100.

Primary Examiner—Timothy P. Callahan
Assistant Examiner—Jeffrey Zweizig
Attorney, Agent, or Firm—Steven R. Biren

[57] ABSTRACT

An integrated half-bridge driver circuit for driving a half-bridge output stage having high-side and low-side power transistors coupled together at a high-voltage output terminal includes a low-voltage control circuit and a floating well within the integrated circuit which has a timing circuit for controlling the activation of the high-side power transistor. The driver circuit further includes a high-voltage interface circuit for coupling a control signal from the low-voltage control circuit to the timing circuit within the floating well. In this manner, an integrated half-bridge driver circuit is obtained which is capable of operating at high frequencies due to the relatively low power dissipation in the control and timing circuitry.

7 Claims, 3 Drawing Sheets

FIG. 3a
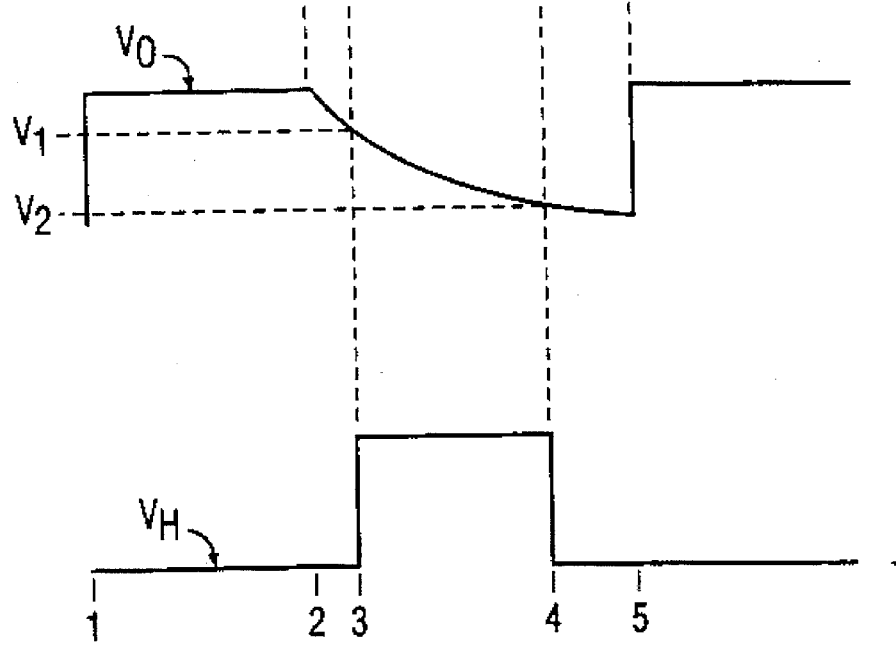
FIG. 3b
FIG. 3c 5,543,740

INTEGRATED HALF-BRIDGE DRIVER CIRCUIT

BACKGROUND OF THE INVENTION

This invention is in the field of half-bridge driver circuits, and relates more particularly to integrated half-bridge driver circuits capable of operating at relatively high frequencies.

Half-bridge driver circuits are presently used to drive power transistors in such applications as power converters in electronic ballasts for high intensity discharge lamps and induction lamps. Although present electronic ballast circuits operate at relatively low frequencies, typically up to several hundred KHz, electronic ballasts currently under development for high intensity discharge lamps will be required to operate at frequencies of over 700 KHz, with electronic ballasts for induction lamps requiring operation at frequencies up to several MHz. For such applications, the use of existing half-bridge driver circuits in the power converters of the electronic ballasts is impractical, because present integrated circuit designs generate high losses and excessive heat at high frequencies, which in practice limits high-voltage high-frequency operation.

A representative prior-art integrated driver circuit is the IR2110, manufactured by International Rectifier. This high-voltage integrated circuit uses a bootstrap capacitor to power the high-side gate drive circuit, which is fabricated in a floating well within the IC. Timing information from a low-voltage control circuit is communicated to the circuitry within the floating well by a level-shifting stage that operates off the high voltage and sends pulses of current to a latch circuit in the floating well. The state of the latch circuit then determines when the high-side power transistor is turned on and off. However, the use of a level shifting stage operating off the high voltage, while effective to transmit timing information to the high-side switch, is a major source of power loss at high frequencies, and in practice limits the frequency of operation of such circuits to about 100 KHz.

Accordingly, it would be desirable to have an integrated half-bridge driver circuit in which power losses due to dissipation in the level shifting circuitry are minimized or eliminated. Additionally, it would be desirable to have an integrated half-bridge driver circuit capable of operating at frequencies substantially higher than the maximum operating frequency of presently-available integrated driver circuits.

SUMMARY OF THE INVENTION

It is thus an object of the invention to provide an integrated half-bridge driver circuit in which timing information is provided without the use of a level-shifting stage operating off the high voltage, in order to substantially eliminate the power loss associated with the operation of such a stage at higher frequencies.

It is a further object of the invention to provide an integrated half-bridge driver circuit capable of operating at frequencies substantially higher than those attainable by present integrated circuits.

In accordance with the invention, these objects are achieved by a new integrated half-bridge driver circuit for driving a half-bridge output stage having high-side and low-side power transistors which are coupled together at a high-voltage voltage output terminal. The driver circuit includes a low-voltage control circuit having a low-voltage input terminal and a control output coupled to a control terminal of the low-side power transistor, and a timing circuit is provided in a floating well within the integrated circuit for controlling the activation of the high-side power transistor. Within the floating well, a floating ground node is provided which is coupled to the high-voltage output terminal of the circuit, and a high-voltage interface circuit is provided for coupling the control output of the low-voltage control circuit to the timing circuit.

In a preferred embodiment of the invention, the timing circuit includes an RC network for generating a decaying voltage signal referenced to the floating ground node from a signal provided from the control output, and timing information for controlling the activation and deactivation of the high-side power transistor is generated by comparing the decaying voltage signal to first and second reference voltages, which are also referenced to the floating ground node.

In a further preferred embodiment of the invention, the circuitry for generating the first and second reference voltages includes first and second capacitors, with one terminal of each capacitor being referenced to the floating ground node, and first and second diodes in the high-voltage interface circuit for coupling first and second substantially constant voltages, respectively, from the low-voltage control circuit to the first and second capacitors to generate the first and second reference voltages in the floating well. Similarly, the high-voltage interface circuit may be provided with a third diode for coupling the control output from the low-voltage control circuit to the RC network in the timing circuit.

In this matter, an integrated half-bridge driver circuit is obtained which eliminates the need for a level-shifting circuit operating off the high voltage as in the prior art, thereby substantially reducing unwanted power loss and permitting operation at substantially higher frequencies.

BRIEF DESCRIPTION OF THE DRAWING

The invention may be more completely understood with reference to the following detailed description, to be read in conjunction with the accompanying drawing, in which:

FIGS. 3a, 3b and 3c show selected voltage waveforms generated during operation of the circuit shown in FIG. 2.

DESCRIPTION OF THE PREFERRED EMBODIMENTS

Figure 1:
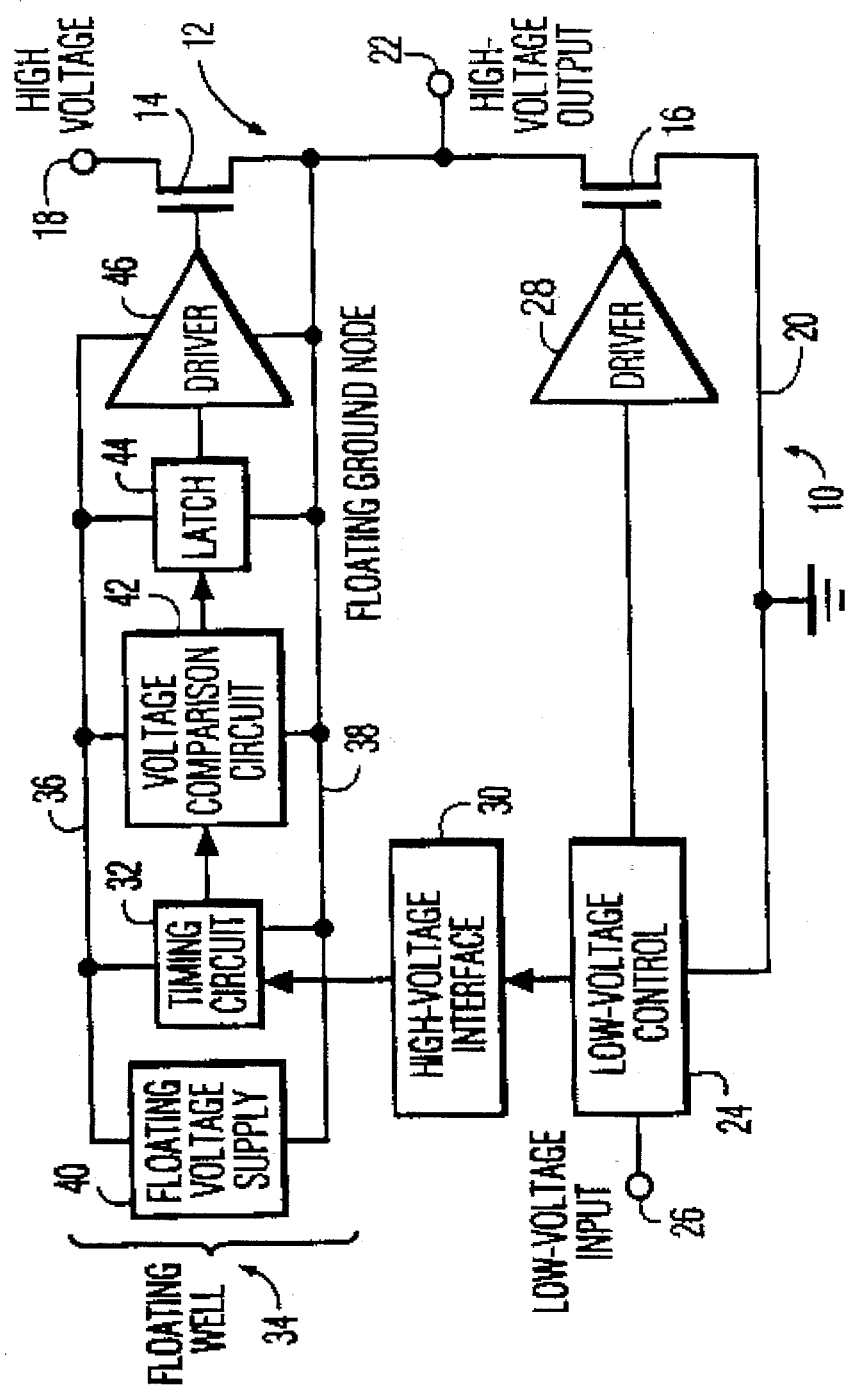
FIG. 1 shows a block diagram of an integrated half-bridge driver circuit in accordance with the invention.

An integrated half-bridge driver circuit 10 in accordance with the invention is shown in block-diagram form in FIG. 1. This circuit is used for driving a half-bridge output stage 12 having high-side and low-side power transistors 14 and 16, respectively, coupled together between a high-voltage terminal 18 and a common or ground node 20 at a high-voltage output terminal 22.

The driver circuit 10 further includes a low-voltage control circuit 24 having a low-voltage input terminal 26 and a control output which is coupled through a driver 28 to the gate of low-side power transistor 16, shown here as an MOS power transistor. The control output of low-voltage control circuit 24 is additionally coupled, via a high-voltage interface circuit 30, to a timing circuit 32 in a floating well 34 of the integrated driver circuit 10. It should be understood that the term "floating well" as used herein, designates a portion of an integrated circuit which is electrically "floating" with respect to other portions of the same integrated circuit, so that both its voltage supply and common or ground connections can "float" or vary with respect to the voltage supply and ground connections for the remainder of the integrated circuit, in a manner well known to those of ordinary skill in this art. Thus, circuits such as timing circuit 32 in the floating well 34 are coupled between a voltage supply line 36 and a floating ground node 38 which is connected to high-voltage output terminal 22. Circuits such as timing circuit 32 in the floating well are powered by a floating voltage supply shown schematically in FIG. 1 by block 40, which is coupled between supply line 36 and floating ground node 38.

The output of timing circuit 32 is coupled to a voltage comparison circuit 42, the output of which is coupled in turn to a latch circuit 44. The output of the latch circuit 44 is provided, through a driver 46, to the gate of high-side power transistor 14 to control the activation and deactivation of MOS transistor 14 in accordance with timing signals generated in the timing circuit 32. Thus, the integrated half-bridge driver circuit of FIG. 1 eliminates the level-shifting circuitry of prior-art driver circuits, and the attendant disadvantages associated with such level-shifting circuits, by using high-voltage interface circuit 30 and timing circuit 32, which together couple signals from the low-voltage control circuit 24 up to the floating well 34, and then generating appropriate timing information from these signals within the floating well 34.

Figure 2:
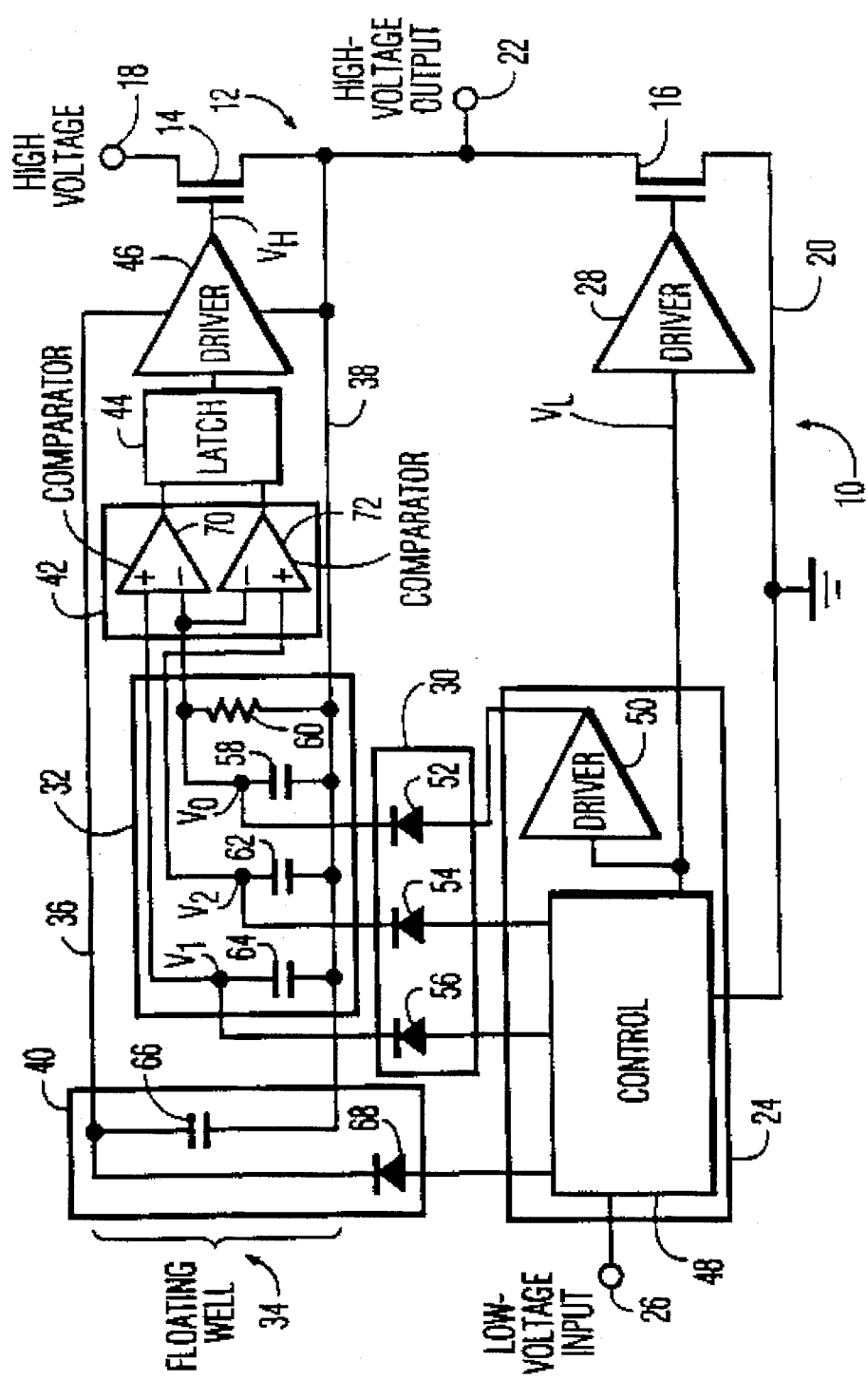
FIG. 2 shows a simplified schematic diagram of the integrated half-bridge driver circuit of FIG. 1.

Further details of the integrated half-bridge driver circuit 10 are shown in the simplified schematic diagram of FIG. 2. In FIG. 2, for simplicity, like reference numerals have been used to identify like components illustrated in FIG. 1 and previously described, with additional detail being shown in the timing and control portion of the circuit relevant to the present invention. It should be understood that the particular circuit configuration shown in FIG. 2 represents a preferred embodiment, and that various alternative circuit configurations can be used for the various blocks shown in FIG. 1 within the scope of the invention.

In FIG. 2, the low-voltage control circuit 24 includes a control circuit 48 and driver 50 for providing the various control and reference voltage signals used by the remainder of the driver circuit. More particularly, control output voltage $V_L$ is coupled from the low-voltage control circuit 24 through driver 28 to the gate of low-side MOS power transistor 16 and, through a driver 50, to high-voltage interface circuit 30. In the embodiment shown in FIG. 2, the high-voltage interface circuit 30 is composed of diodes 52, 54 and 56, although other high-voltage coupling components, such as MOS transistors, may alternatively be used. High-voltage interface circuit 30 is coupled by coupling diode 52 to an RC network composed of capacitor 58 and resistor 60, with diode 54 being coupled to capacitor 62 and diode 56 being coupled to capacitor 64. Resistor 60, and capacitors 58, 62 and 64 are all referenced to the floating ground node 38.

The floating voltage supply 40 in this embodiment is composed of a bootstrap capacitor 66 coupled to low-voltage control circuit 24 by a diode 68, with a DC voltage from control circuit 48 within the low-voltage control circuit 24 being provided through diode 68 to charge bootstrap capacitor 66 to a voltage above that of floating ground node 38 when this node is at a low voltage. In this manner, a voltage is generated across bootstrap capacitor 66 to provide a power supply voltage to the circuitry within floating well 34, with diode 68 becoming reverse-biased when the voltage on voltage supply line 36 within the floating well rises to a high voltage value with reference to the common or ground node 20 of the driver circuit.

Within the timing circuit 32, reference voltages $V_1$ and $V_2$ are generated across capacitors 64 and 62, respectively, from substantially constant voltages generated in control circuit 48 and coupled to the capacitors 64 and 62 by diodes 56 and 54, respectively. Similarly, control output voltage $V_L$ is coupled through driver 50 and diode 52 to the RC network 58,60 to generate a decaying voltage signal $V_0$, with voltages $V_0$, $V_1$ and $V_2$ all referenced to the floating ground node 38.

Reference voltages $V_1$ and $V_2$, and decaying voltage signal $V_0$, are coupled to comparators 70 and 72 within voltage comparison circuit 42, with the output of these two comparators being coupled to latch circuit 44. The remainder of the circuit shown in FIG. 2 is the same as shown and described in connection with FIG. 1, and accordingly will not be described in further detail here.

The operation of the circuit of FIG. 2 may be more easily understood with reference to the timing diagrams of FIGS. 3a, 3b and 3c, which show the voltage levels of the waveforms $V_L$, $V_0$, and $V_H$ along the vertical axis, as a function of time along the horizontal axis, with five specific points in time being labelled 1 through 5 for reference.

At time point 1, the control output voltage $V_L$ goes high and is coupled through driver 28 to the gate of low-side power MOS transistor 16 to turn that transistor on and cause the high-voltage output terminal 22 to go low. At the same time, voltage $V_2$ is coupled through driver 50 and diode 52 to charge capacitor 58 in timing circuit 32 to a high initial voltage with reference to floating ground node 38 which, since it is connected directly to output node 22, is at this point in time at a low voltage. At the same time, capacitors 64 and 62 are similarly charged to voltage levels $V_1$ and $V_2$ from substantially constant voltages provided from control circuit 48 through diodes 56 and 54, respectively. The relationship between the initial value of these voltages is such that $V_0 > V_1 > V_2$, as shown in FIG. 3b. Then, at time point 2, voltage $V_L$ goes low, and voltage $V_0$ begins to decay as capacitor 58 discharges through resistor 60, since voltage $V_0$ is no longer held at its substantially constant initial value by the voltage provided through diode 52. During the time period between points 2 and 3, the value of voltage $V_0$ provided to the voltage comparison circuit 42 is greater than both $V_1$ and $V_2$ and the latch circuit 44 and driver circuit 46 accordingly provide a low initial value for voltage $V_H$ at the gate of high-side MOS power transistor 14, thus ensuring that this transistor is off while low-side MOS power transistor 16 is on and for a short interval thereafter.

When the voltage $V_0$ decays sufficiently such that its value drops below reference voltage level $V_1$, as shown at time point 3 in FIG. 3b, this change in voltage levels will be detected by comparator 70, which will activate latch circuit 44 and driver 46 to cause voltage $V_H$ to go high, thus activating high-side power transistor 14. It should be noted that while high-side transistor 14 is not activated until time point 3, low-side power transistor 16 is deactivated at earlier time point 2, thus avoiding any overlap in activation of the two power transistors, which would result in an undesirable and possibly damaging current surge between the high voltage terminal 18 and ground terminal 20.

Subsequently, at time point 4, the voltage $V_0$ has further decayed and passes below the value of reference voltage $V_2$, and this change in voltage levels will be detected by comparator 72, which will cause latch circuit 44 and driver 46 to return voltage $V_H$ to its low level, thereby turning high-side power transistor 14 off. Finally, at time point 5, $V_L$ will again go high, activating low-side power transistor 16 through driver 28, and the cycle will repeat. It is important to note that the voltage $V_H$ returns to its low level at time point 4, thus deactivating high-side power transistor 14, before voltage $V_L$ goes high at time point 5 to activate low-side power transistor 16, again avoiding an undesirable and potentially damaging situation involving the simultaneous conduction of both power transistors.

Additionally, it should be noted that all of the timing information is generated from low-voltage signals $V_0$, $V_1$ and $V_2$ provided from the low-voltage control circuit 24 while the floating ground node 38 is at its low level, thus avoiding the necessity for high-voltage level-shifting circuits to convey this information to the floating well as in the prior art. Furthermore, since all of the relevant parameters (the voltages $V_0$, $V_1$ and $V_2$ and the values of capacitor 58 and resistor 60) are determined by easily-controlled low voltages and easily-calculated component values, both the "dead-time" (the time between time points 2 and 3, and between time points 4 and 5) and the high-side pulse width (the time between time points 3 and 4) can be easily and accurately determined by the appropriate selection of low-voltage levels and component values.

The integrated half-bridge driver circuit described above is capable of efficiently driving a half-bridge output stage without the need for a level-shifting circuit operating off the high voltage as is required in comparable prior-art circuits. This substantially reduces unwanted power losses in the driver circuit and permits operation at substantially higher frequencies than the prior-art circuits.

While the invention has been particularly shown and described with reference to preferred block-diagram and schematic embodiments thereof, it will be understood by those skilled in the art that various changes in form and detail may be made without departing from the spirit and scope of the invention. Thus, for example, the diodes in the high-voltage interface circuit 30 may be replaced by other high-voltage components such as MOS transistors, other timing schemes such as a digital counter may be substituted for the simple RC network 58, 60, and different circuitry may be used for generating the reference voltages and comparing the voltage levels.

What is claimed is:

1. An integrated half-bridge driver circuit for driving a half-bridge output stage having high-side and low-side power transistors coupled together at a high-voltage output terminal, which comprises:

a low-voltage control circuit having a low-voltage input terminal and a control output coupled to a control terminal of said low-side power transistor;

a floating well in said integrated half-bridge driver circuit and comprising a timing circuit for controlling the activation of said high-side power transistor, a floating ground node of said floating well being coupled to said high-voltage output terminal; and a high-voltage interface circuit for coupling said control output of said low-voltage control circuit to said timing circuit.

2. An integrated half-bridge driver circuit as in claim 1, wherein said timing circuit comprises an RC network for generating a decaying voltage signal referenced to said floating ground node from a signal provided from said control output.

3. An integrated half-bridge driver circuit as in claim 2, wherein said floating well further comprises means for generating first and second reference voltages referenced to said floating ground node, said first reference voltage being less than an initial value of said decaying voltage signal and said second reference voltage being less than said first reference voltage, said high-side power transistor being activated when said decaying voltage signal reaches the value of said first reference voltage and being deactivated when said decaying voltage signal reaches the value of said second reference voltage.

4. An integrated half-bridge driver circuit as in claim 3, wherein said floating well further comprises a first comparator for comparing said decaying voltage signal to said first reference voltage to control the activation of said high-side power transistor and a second comparator for comparing said decaying voltage signal to said second reference voltage to control the deactivation of said high-side power transistor.

5. An integrated half-bridge driver circuit as in claim 3, wherein said means for generating said first and second reference voltages comprises first and second capacitors, a first terminal of each of said first and second capacitors being coupled to said floating ground node.

6. An integrated half-bridge driver circuit as in claim 5, wherein first and second substantially constant voltages are generated in said low-voltage control circuit, and said high-voltage interface circuit comprises first and second diodes for coupling said first and second substantially constant voltages, respectively, to a second terminal of said first and second capacitors to generate said first and second reference voltages in said floating well.

7. An integrated half-bridge driver circuit as in claim 6, wherein said high-voltage interface circuit further comprises a third diode for coupling said control output to said RC network in the timing circuit.

\* \* \* \* \*